(12) United States Patent
Harris et al.

(10) Patent No.: US 7,728,403 B2
(45) Date of Patent: Jun. 1, 2010

(54) SEMICONDUCTOR DEVICE

(75) Inventors: Christopher Harris, Rockville, MD (US); Cem Basceri, Reston, VA (US); Kent Bertilsson, Sundsvall (SE)

(73) Assignee: Cree Sweden AB, Kista (SE)

( * ) Notice: Subject to any disclaimer, the term of this patent is extended or adjusted under 35 U.S.C. 154(b) by 0 days.

(21) Appl. No.: 11/444,106

(22) Filed: May 31, 2006

(65) Prior Publication Data

US 2007/0278609 A1 Dec. 6, 2007

(51) Int. Cl.
*H01L 29/47* (2006.01)
(52) U.S. Cl. ............... 257/484; 257/471; 257/472; 257/473; 257/486; 257/454; 257/155; 257/284
(58) Field of Classification Search ............ 257/471, 257/473, 484, 485, 486, 284, 472, 454, 155
See application file for complete search history.

(56) References Cited

U.S. PATENT DOCUMENTS

| | | | |
|---|---|---|---|
| 4,573,066 A * | 2/1986 | Whight | 357/52 |
| 4,982,260 A * | 1/1991 | Chang et al. | 357/38 |
| 5,241,195 A * | 8/1993 | Tu et al. | 257/155 |
| 5,719,409 A * | 2/1998 | Singh et al. | 257/77 |
| 6,861,723 B2 | 3/2005 | Willmeroth | |
| 2003/0020133 A1 | 1/2003 | Dahlqvist et al. | |
| 2003/0020135 A1 | 1/2003 | Kaminski et al. | |
| 2005/0012143 A1 * | 1/2005 | Tanaka et al. | 257/328 |
| 2006/0131686 A1 * | 6/2006 | Wu | 257/484 |
| 2007/0075391 A1 * | 4/2007 | Aslam et al. | 257/476 |

* cited by examiner

*Primary Examiner*—Cuong Q Nguyen
*Assistant Examiner*—Trang Q Tran
(74) *Attorney, Agent, or Firm*—Dilworth & Barrese LLP

(57) ABSTRACT

A semiconductor device of unipolar type has Schottky-contacts (6) laterally separated by regions in the form of additional layers (7, 7") of semiconductor material on top of a drift layer (3). Said additional layers being doped according to a conductivity type being opposite to the one of the drift layer. At least one (7") of the additional layers has a substantially larger lateral extension and thereby larger area of the interface to the drift layer than adjacent such layers (7) for facilitating the building-up of a sufficient voltage between that layer and the drift layer for injecting minority charge carriers into the drift layer upon surge for surge protection.

28 Claims, 1 Drawing Sheet

SEMICONDUCTOR DEVICE

TECHNICAL FIELD OF THE INVENTION AND PRIOR ART

The present invention relates to a semiconductor device having a source contact and a drain contact interconnected by a drift layer doped by dopants according to a first conductivity type, n or p, for majority charge carrier transport in a conducting path between the source contact and the drain contact in a forward biased state of the device, said device comprising on top of the drift layer a plurality of metal layer regions belonging to the source contact making Schottky-contacts to the drift layer and being laterally separated by regions in the form of additional layers of semiconductor material on top of said drift layer and doped by dopants according to a second conductivity type being opposite to said first type for forming pn-junctions at the interface thereof to the drift layer and adapted to form a continuous blocking pn-junction in the reverse biased state of the device shielding said Schottky-contact regions, said source contact being applied also on said additional layers.

A semiconductor device of this type may be called Merged Pn/Schottky-diode (MPS). It is pointed out that said drift layer may have one or more sub-layers with different doping concentrations.

A semiconductor device of this type combines the features of a Schottky-diode with a low on-state voltage in the forward conducting state and of a pn-diode having a higher breakdown field strength in the reverse biased blocking state of the device.

It is desired to have the distance between adjacent said additional layers as large as possible, so that the Schottky-contact regions have the largest possible total area, since this means a lower resistance of the device in the forward biased state thereof. However, the distance between adjacent such additional layers may not be so large that a pn-junction shielding the Schottky-contact regions in the reverse biased blocking state of the device may not be reliably obtained.

The present invention comprises devices of all types of semiconductor materials, but the case of SiC will now be described for illuminating but not in any way restricting the invention.

A component of SiC will under normal operation have an on-state voltage in the region of 1.5 V and the current therethrough may for instance be 5 A. However, a current in the region of 50 A may flow through the device on occurrence of surge, which may result in a temperature rise of the device destroying it. The voltage between each said additional layer and drift layer portions close thereto may rise to a sufficient level, which is above 2.8 V for SiC, for starting an injection of minority charge carriers into the drift layer from such an additional layer if the surge is sufficiently powerful. This would then reduce the resistance of the drift layer and thereby the temperature thereof and function as a surge protection. However, as a consequence of the injection of majority charge carriers from the Schottky-contacts into the drift layer portions close to said additional layers the voltage required for such a surge protection may under certain circumstances not be obtained before the device has already been destroyed.

SUMMARY OF THE INVENTION

The object of the present invention is to provide a semiconductor device of the type defined in the introduction improving the behaviour at surge with respect to such devices already known.

This object is according to the invention obtained by providing such a device in which at least one of said additional layers has a substantially larger lateral extension and thereby larger area of the interfaces to the drift layer than adjacent such layers for facilitating the building-up of a sufficient voltage between that layer and the drift layer for injecting minority charge carriers from that layer into the drift layer upon surge in a forward conducting state of the device for reducing the resistance of the drift layer and thereby the temperature thereof at such surge.

By this new approach for surge protection a voltage between said at least one additional layer and drift layer portions close thereto being sufficient for the injection of minority charge carriers into the drift layer for surge protection may be obtained earlier than before, so that the temperature of the device at surge may be restricted and the device be protected against destruction. The wider said additional layer means that the building-up of said voltage will not be disturbed so much by majority charge carrier injection from adjacent Schottky-contacts as if said additional layer would be more narrow. It has been found that it is not necessary to have all said additional layers with a large lateral extension, which would then mean a substantially higher resistance of the device in the forward conducting state at normal operation of the device, but it is sufficient for obtaining an efficient surge protection to have only some of them with such a larger lateral extension.

According to an embodiment of the invention in the lateral direction along the top of the drift layer at least every seventh, advantageously at least every sixth, preferably at least every fifth and most preferred every fourth or every third of said additional layers has a substantially larger lateral extension than adjacent such additional layers. These proportions of the number of additional layers with a larger lateral extension with respect to other said additional layers results in an efficient surge protection of the device. Accordingly, the majority of the additional layers may have a smaller lateral extension being favourable from the point of view of forward conduction and still an efficient surge protection be obtained.

According to another embodiment of the invention said at least one additional layer has a said lateral extension being equal to the lateral extension of said adjacent additional layers multiplied by a factor of at least 1.5, advantageously at least 2, preferably 2-4 and most preferred 3-4. Such a lateral extension of said at least one additional layer results in substantially improved properties with respect to the building-up of a voltage sufficient for minority charge carrier injection with respect to said adjacent additional layers.

According to another embodiment of the invention the lateral extension of said at least one additional layer is 5 μm-15 μm, whereas the lateral extension of adjacent such additional layers is 2 μm-4 μm.

According to another embodiment of the invention the lateral distance between adjacent additional layers is substantially constant along the top of the drift layer, and as said before this lateral distance shall be as large as possible while still guaranteeing an efficient shielding of the Schottky-contact regions in the reverse biased blocking state of the device.

According to another embodiment of the invention said Schottky-contact regions and said additional layers are arranged on top of the drift layer in the form of concentric rings each having a substantially constant width and said lateral extension means the direction according to a radius of these rings. Accordingly, said at least one additional layer having a substantially larger lateral extension is formed by a ring having a substantially larger width than adjacent additional layer rings.

According to another embodiment of the invention the distance between adjacent additional layers is approximately the same or smaller than the thickness of the drift layer, which means that the Schottky-contact regions may be reliably shielded by a continuous blocking pn-junction in the reverse biased state of the device.

According to another embodiment of the invention said drift layer has a thin low doped first sub-layer next to the Schottky-contact regions and said additional layers and a highly doped second sub-layer thereunder next to the drain contact.

According to another embodiment of the invention said Schottky-contact regions are located at the bottom of a recess into the drift layer each separating adjacent said additional layers and positioning said Schottky-contact at a vertical distance to the interfaces between said additional layers and the drift layer. This vertical distance means that majority charge carriers injected from the Schottky-contacts will have a reduced influence upon the building-up of a sufficient voltage between said additional layers and drift layer portions close thereto for injection of minority charge carriers from said additional layers into the drift layer for surge protection.

According to another embodiment of the invention said additional layers are highly doped, which improves the characteristics of the device both in the reverse biased blocking state and for surge protection in the forward conducting state thereof.

According to another embodiment of the invention the semiconductor layers of the device are made of SiC, and said first conductivity type is n and said second conductivity type is p for surge protection by hole injection into the drift layer. Current flow through electron transport is most efficient in SiC with the dopants available today, and the case is the opposite for diamond, and according to another embodiment of the invention the semiconductor layers thereof are made of diamond, and said first conductivity type is p and said second conductivity type is n for surge protection by electron injection into the drift layer.

Such devices of SiC or diamond are particularly interesting for high power applications, especially when they have to be switched on and off at high frequencies due to the possibility of making the devices very thin and still able to hold high voltages in the blocking state thereof in combination with the stability of these materials at high temperatures and the high thermal conductivity thereof.

Further advantages as well as advantageous features of the invention will appear from the following description of embodiments thereof.

BRIEF DESCRIPTION OF THE DRAWING

With reference to the appended drawing, below follows a specific description of embodiments of the invention cited as examples.

In the drawing.

It is pointed out that the drawings are not to scale and that the proportions of thicknesses of different layers may be totally different and the drawings are only for illustrating the principles of prior art devices and the devices according to the invention.

DESCRIPTION OF THE PRIOR ART

Figure 1:
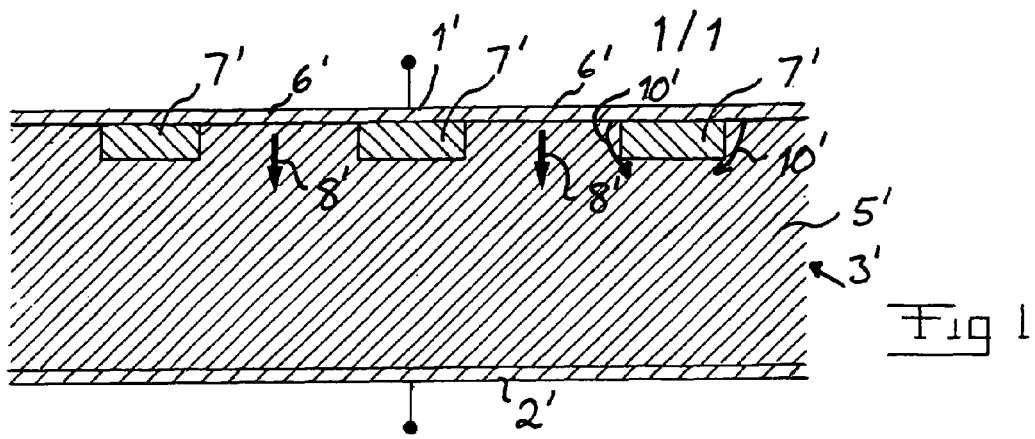
FIG. 1 is a very schematic cross-section view of a known semiconductor device of the type according to the present invention in the forward conducting state thereof.
Figure 2:
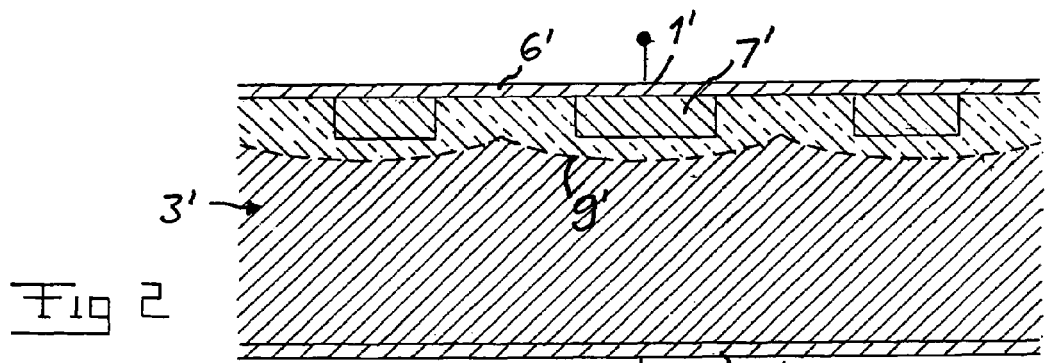
FIG. 2 is a view similar to FIG. 1 of the device according to FIG. 1 in the reverse biased blocking state thereof.

FIG. 1 shows a known semiconductor device having a source contact 1' and a drain contact 2' separated by a drift layer 3' doped according to a first conductivity type, here being n. The drift layer has here only one sub-layer, namely a highly doped sub-layer 5'. The device further comprises on top of the drift layer a plurality of metal layer regions 6' belonging to the source contact making Schottky-contacts to the drift layer and being laterally separated by regions 7' in the form of additional layers of semiconductor material on top of the drift layer and doped by dopants according to a second conductivity type, which in this case is p. These additional layers 7' are preferably highly doped. Said additional layers 7' form pn-junctions at the interface thereof to the drift layer. The operation of this device is as follows: when the device is in a forward conducting state electrons will be injected from the Schottky-contact region 6' according to the arrows 8' into the drift layer for a transport of majority charge carriers to the drain contact 2'. The on-state voltage of the device will be low thanks to the low barrier height of the Schottky-contacts. In the reverse biased blocking state of the device said additional layers 7' will deplete the portions of the drift layers thereunder and between adjacent such additional layers, so that a continuous blocking pn-junction 9' (see FIG. 2) shielding the Schottky-contact regions 6' is obtained.

The additional layers 7' all have the same width or lateral extension and are made as narrow as possible while still making it possible to obtain said continuous blocking pn-junction in the reverse biased state for obtaining the best possible on-state characteristics. This results in the problems discussed above to obtain a sufficient voltage between said additional layers 7' and drift layer portions close thereto upon surge for creating an injection of holes from the additional regions 7' into the drift layer and thereby reducing the temperature of the device and protecting the device at surge.

DETAILED DESCRIPTION OF EMBODIMENTS OF THE INVENTION

Figure 3:
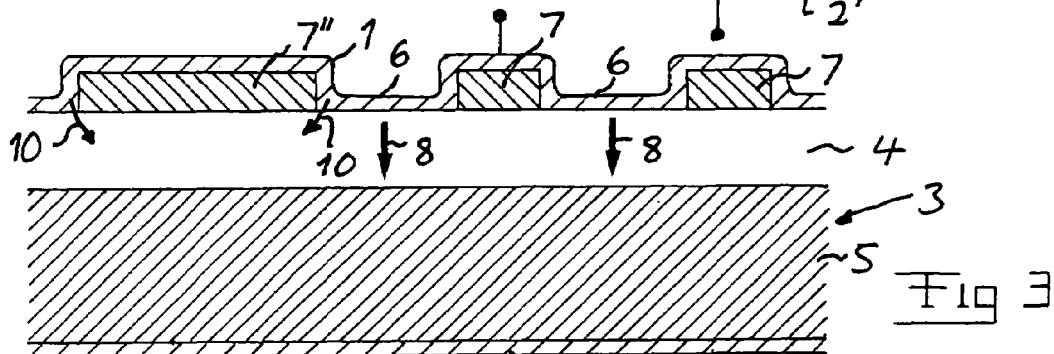
FIG. 3 is a view similar to FIG. 1 of a device according to a first embodiment of the invention.

The present invention addresses this problem, and a device according to a first embodiment of the invention is schematically shown in FIG. 3. Parts of this device corresponding to parts of the prior art device according to FIGS. 1 and 2 have been provided with the same reference numerals. The semiconductor material of this device is SiC. This device differs from known such devices by the fact that the drift layer 3 has two sub-layers, namely a first low doped sub-layer 4 closest to the source contact and a lower highly doped second sub-layer 5 closest to the drain contact and that at least one said additional layer 7" has a substantially larger lateral extension and thereby larger area of the interface to the drift layer than adjacent such layers 7. Said additional layers and the Schottky-contact regions 6 are in the present case arranged on top of the drift layer 3 in the form of concentric rings each having a substantially constant width and said lateral extension means the direction according to a radius of these rings. This means in the present case that said at least one additional layer 7" has a width being equal to the width of said adjacent additional layers 7 multiplied by a factor of 3. Every seventh, every sixth, every fifth, every fourth or every third of said additional layers seen in the direction of said radius may have a width corresponding to the width of said at least one additional layer 7". Other relations between the number of wider said additional layers and the other adjacent additional layers are also conceivable.

The width of said at least one additional layer 7" is in this embodiment approximately 10 μm, whereas the width of the adjacent additional layers is approximately 3 μm. The additional layers 7, 7" cover in this case approximately 20% of the top surface of the drift layer, and this coverage is substantially the same as for the prior art device shown in FIGS. 1 and 2.

The function of the device according to the invention shown in FIG. 3 will be substantially the same as for the device according to FIG. 1 under normal operation in the forward conducting state as well as in the reverse biased state. However, the surge protection of this device will be remarkably improved with respect to the device according to FIG. 1. The reason for this is that upon surge, in which the current may increase from for instance 5 A to 50 A electrons, injected into the drift layer close to a said additional layer as shown through the arrows 10' in FIG. 1, will counteract a building-up of a sufficient voltage, in the case of SiC, 2.8 V, between an additional layer 7' and the drift layer portions next thereto. However, such injected electrons according to the arrows 10 close to said at least one additional layer 7" with a substantially greater width than adjacent such additional layers 7 will not substantially disturb the building-up of a sufficient voltage between the layer 7" and the drift layer thereunder, so that minority charge carries in the form of holes will be injected into the drift layer and thereby lowering the resistance of the device and the temperature thereof at said high surge currents much earlier.

Figure 4:
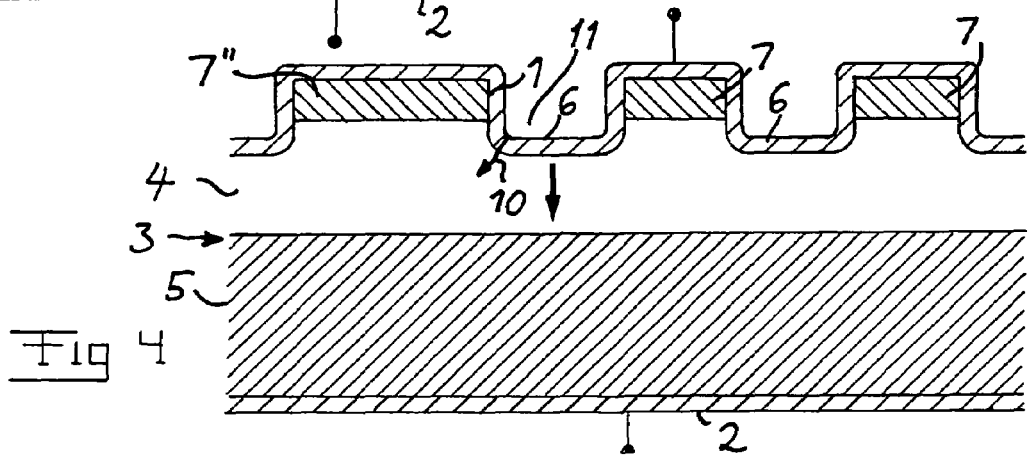
FIG. 4 is a view similar to FIG. 1 of a device according to a second embodiment of the invention.

FIG. 4 illustrates a device according to a second embodiment of the invention differing from the one shown in FIG. 3 by the arrangement of the Schottky-contact regions 6 at the bottom of a recess or trench 11 into the drift layer each separating adjacent said additional layers and positioning said Schottky-contacts at a vertical distance to the interfaces between said additional layers 7, 7" and the drift layer. This vertical distance between the Schottky-contacts and said interface means that electrons injected into the drift layer from the Schottky-contacts upon surge will disturb the building-up of a sufficient voltage between the additional layers 7, 7" and the drift layer for hole injection into the drift layer. The width of said at least one additional layer is in this embodiment two times the width of adjacent additional layers 7, which means that said voltage will upon surge be easier and faster built-up for the additional layer 7" than for the other additional layers 7.

A difference between low doped and highly doped means in this context a difference in doping concentration of at least a factor 10, and in the case of SiC said first sub-layer may have a doping concentration below $10^{15}$ cm$^{-3}$, whereas the second sub-layer has a doping concentration above $10^{16}$ cm$^{-3}$. It is not known from the prior art to include a sub-layer of a different doping level in the drift region to enhance injection as done through arranging said first sub-layer 4.

The invention is of course not in any way restricted to the embodiments described above, but many possibilities to modifications thereof will be apparent to a person with ordinary skill in the art without departing from the basic idea of the invention as defined in the appended claims.

It is within the scope of the invention to have said additional layers with a substantially larger lateral extension with different widths, so that one may be three times as wide as the majority of the other additional layers and another 2.5 times as wide as those layers.

With respect to SiC the invention is not restricted to any particular polytype.

The invention claimed is:

1. A semiconductor device having
    a source contact (1) and a drain contact (2) interconnected by a drift layer (3) doped by dopants according to a first conductivity type, n or p and in a conducting path between the source contact and the drain contact in a forward biased state of the device,
    on top of the drift layer (3), a plurality of metal layer regions (6) belonging to the source contact making Schottky-contacts to the drift layer (3) and being laterally separated by regions in the form of additional layers (7,7") of semiconductor material doped by dopants according to a second conductivity type being opposite to said first type constituting pn-junctions at the interface thereof to the drift layer (3) and a continuous blocking pn-junction in the reverse biased state of the device shielding said Schottky-contact regions,
    said source contact on said additional layers, wherein
    at least one (7") of said additional layers having a substantially larger lateral extension and area of the interface to the drift layer (3) than adjacent such layers (7), and
    each said additional layer (7, 7") is located on top of said drift layer (3) while forming an interface to said drift layer (3) laterally restricted by said Schottky-contact regions (6),
    with said metal layer regions (6) situated on a side of said additional layers (7, 7") opposite said drift layer (3) and also laterally bordering said additional layers (7, 7") and separating said additional layers (7, 7") from one another,
    such that said metal layer regions (6) completely border each said additional layer (7, 7") on all sides except a side on the drift layer (3).

2. A device according to claim 1, wherein in the lateral direction along the top of the drift layer (3) at least every seventh of said additional layers (7, 7") has a substantially larger lateral extension than adjacent such additional layers.

3. A device according to claim 1, wherein at least one additional layer (7") has a lateral extension being equal to the lateral extension of said adjacent additional layers (7) multiplied by a factor of at least 1.5.

4. A device according to claim 1, wherein the lateral extension of said at least one additional layer (7") is approximately 5 μm-15 μm, and the lateral extension of adjacent such additional layers (7) is approximately 2 μm-4 μm.

5. A device according to claim 1, wherein the lateral distance between adjacent additional layers (7, 7") is substantially constant along the top of the drift layer (3).

6. A device according to claim 1, wherein said Schottky-contact regions (6) and said additional layers (7,7") are arranged on top of the drift layer (3) in the form of concentric rings each having a substantially constant width and said lateral extension is in the direction according to a radius of these rings.

7. A device according to claim 5, wherein the distance between adjacent additional layers (7,7") is approximately the same or smaller than the thickness of the drift layer (3).

8. A device according to claim 1, wherein said drift layer (3) has a thin low doped first sublayer (4) next to the Schottky-contact regions (6) and said additional layers (7, 7") and a higher doped second sub-layer (5) thereunder next to the drain contact (2).

9. A device according to claim 1, wherein said Schottky-contact regions (6) are located at the bottom of a recess (11) into the drift layer (3) each separating adjacent said additional layers (7,7") and positioning said Schottky-contacts at a vertical distance below the interfaces between said additional layers (7,7") and the drift layer (3).

10. A device according to claim 1, wherein said additional layers (7,7") are highly doped.

11. A device according to claim 1, wherein the semiconductor layers (3, 7, 7") thereof are made of SiC, and said first conductivity tape is n and said second conductivity type is p for surge protection by hole injection into the drift layer.

12. A device according to claim 1, wherein the semiconductor layers (3,7,7") thereof are made of diamond, and said first conductivity type is p and said second conductivity type is n for surge protection by electron injection into the drift layer.

13. A device according to claim 3, wherein the lateral extension is multiplied by a factor of at least 2.

14. A device according to claim 13, wherein the lateral extension is multiplied by a factor of about 2-4.

15. A device according to claim 14, wherein the lateral extension is multiplied by a factor of about 3-4.

16. A semiconductor device having
   a source contact (1) and a drain contact (2) interconnected by a drift layer (3) doped by dopants according to a first conductivity type, n or p and in a conducting path between the source contact and the drain contact in a forward biased state of the device,
   on top of the drift layer (3), a plurality of metal layer regions (6) belonging to the source contact making Schottky-contacts to the drift layer (3) and being laterally separated by regions in the form of additional layers (7,7") of semiconductor material on top of said drift layer (3) and doped by dopants according to a second conductivity type being opposite to said first type constituting pn-junctions at the interface thereof to the drift layer (3) and a continuous blocking pn-junction in the reverse biased state of the device shielding said Schottky-contact regions,
   said source contact on said additional layers, wherein
   at least one (7") of said additional layers having a substantially larger lateral extension and area of the interface to the drift layer (3) than adjacent such layers (7),
   said drift layer (3) has two sub-layers, a first low doped sublayer (4) closest to the source contact (1) and a highly-doped second sub-layer (5) closest to the drain contact (2), and
   said metal layer regions (6) are situated on a side of said additional layers (7, 7") opposite said drift layer (3) and also laterally border said additional layers (7, 7") to separate said additional layers (7, 7") from one another, such that said metal layer regions (6) completely border each said additional layer (7, 7") on all sides except a side on the drift layer (3).

17. A device according to claim 16, wherein said semiconductor layers (3, 7, 7") thereof are made of SiC, said first conductivity type is n and said second conductivity type is p for surge protection by hole injection into the drift layer (3) and said first sub-layer (4) has a doping concentration below $10^{15}$ cm$^{-3}$ and said second sub-layer (5) has a doping concentration above $10^{16}$ cm$^{-3}$.

18. A device according to claim 2, wherein in the lateral direction along the top of the drift layer (3) at least every sixth of said additional layers (7, 7") has a substantially larger lateral extension than adjacent such additional layers.

19. A device according to claim 18, wherein in the lateral direction along the top of the drift layer (3) at least every fifth of said additional layers (7, 7") has a substantially larger lateral extension than adjacent such additional layers.

20. A device according to claim 19, wherein in the lateral direction along the top of the drift layer (3) at least every fourth of said additional layers (7, 7") has a substantially larger lateral extension than adjacent such additional layers.

21. A device according to claim 20, wherein in the lateral direction along the top of the drift layer (3) at least every third of said additional layers (7, 7") has a substantially larger lateral extension than adjacent such additional layers.

22. A device according to claim 1, wherein each said additional layer (7, 7") comprises a substantially rectangular cross-section bordering said metal layer regions (6) on three sides and drift layer (3) on one side.

23. A device according to claim 1, wherein said metal layer regions (6) wrap around each said additional layer (7, 7") such that edges of said metal layer regions (6) wrapping around each said additional layer (7, 7") in a direction extending away from said drain contact (2) and drift layer (3) are substantially parallel and define an open trench or recess (11) between the edges of said metal layer regions (6) and in a lateral direction between said adjacent additional layers (7, 7").

24. A device according to claim 16, wherein said Schottky-contact regions (6) are located at the bottom of a recess (11) into the drift layer (3) each separating adjacent said additional layers (7,7") from one another in a lateral direction and positioning said Schottky-contacts at a vertical distance normal to the lateral direction and below the interfaces between said additional layers (7,7") and the drift layer (3) on respective sides of said additional layers (7,7").

25. A device according to claim 16, wherein each said additional layer (7, 7") comprises a substantially rectangular cross-section bordering said metal layer regions (6) on three sides and drift layer (3) on one side.

26. A device according to claim 16, wherein said metal layer regions (6) wrap around each said additional layer (7, 7") such that edges of said metal layer regions (6) wrapping around each said additional layer (7, 7") in a direction extending away from said drain contact (2) and drift layer (3) are substantially parallel and define an open trench or recess (11) between the edges of said metal layer regions (6) and in a lateral direction between said adjacent additional layers (7, 7").

27. A device according to claim 1, wherein said metal layer regions (6) border each said additional layer (7, 7") on all sides except a side of each said additional layer (7, 7") bordering the drift layer (3) and only said metal layer regions (6) and drift layer (3) border each said additional layer (7, 7").

28. A device according to claim 16, wherein said metal layer regions (6) border each said additional layer (7, 7") on all sides except a side of each said additional layer (7, 7") bordering the drift layer (3) and only said metal layer regions (6) and drift layer (3) border each said additional layer (7, 7").

* * * * *